(12) United States Patent
Lauinger

(10) Patent No.: US 6,241,823 B1
(45) Date of Patent: Jun. 5, 2001

(54) ARRAY AND METHOD FOR COATING OF OBJECTS

(75) Inventor: Thomas Lauinger, Niedernberg (DE)

(73) Assignee: Angewandte Solarenergie ASE GmbH, Alzenau (DE)

( * ) Notice: Subject to any disclaimer, the term of this patent is extended or adjusted under 35 U.S.C. 154(b) by 0 days.

(21) Appl. No.: 09/318,605

(22) Filed: May 26, 1999

(30) Foreign Application Priority Data

May 29, 1998 (DE) .............................. 198 24 040

(51) Int. Cl.⁷ ..................... C23C 16/00; C23C 16/458
(52) U.S. Cl. ........................................... 118/718
(58) Field of Search ........................ 118/718, 719; 414/910, 935, 937, 939, 941

(56) References Cited

U.S. PATENT DOCUMENTS

| | | | | |
|---|---|---|---|---|
| 5,122,391 | * | 6/1992 | Mayer | 427/126.3 |
| 5,626,677 | | 5/1997 | Shirahata . | |
| 6,163,145 | * | 12/2000 | Yamada et al. | 324/158.1 |

FOREIGN PATENT DOCUMENTS 0574178    12/1993   (EP) .

* cited by examiner

Primary Examiner—Gregory Mills
Assistant Examiner—Sylvia R. MacArthur
(74) Attorney, Agent, or Firm—Dennison, Scheiner, Schultz & Wakeman

(57) ABSTRACT

An apparatus for performing two-dimensional surface coating of objects includes a hollow cylinder open at opposite ends thereof, a plunger axially moveable therein and having at least one receptacle with a receiving opening of an axial extent through which the object can be inserted and removed, and a first conveying device for conveying objects to be coated. The hollow cylinder has at least one first area and a second area which can be sealed off from the plunger, the at least one first area being at an end of the hollow cylinder and having an axial extent greater than the axial extent of the receiving opening. The second area is sealed against atmospheric pressure relative to the plunger regardless of plunger position. The second area of the hollow cylinder is constructed and arranged for passing transversely therethrough by the conveying device when the receptacle is aligned therewith, for transfer of an object to or from a coating device.

14 Claims, 2 Drawing Sheets

ARRAY AND METHOD FOR COATING OF OBJECTS

BACKGROUND OF THE INVENTION

The invention relates to an array and to a method for coating of objects, in particular plate-like objects such as semiconductor components, preferably Si wafers with surface coatings, comprising a device for supplying and transferring of at least one uncoated object to a coating device such as a chamber and for extracting and removing a coated object therefrom.

In the photovoltaic industry, systems for low-pressure gas phase deposition are used for, among other things, the manufacture of amorphous thin-film solar cells and for the manufacture of thin surface coatings on crystalline solar cells. PECVD, or plasma-enhanced chemical vapor deposition, is becoming increasingly preferred over thermal activation, since the latter is unsuitable for many applications because of the high temperatures needed (>700° C.) (see for example U.S. Pat. No. 5,626,677 or Vossen, Kern, Thin Film Processes, Academic Press, Inc., London, 1978, p. 337–342, or Rossnagel et al., Handbook of Plasma Processing Technology, Noyes Publications, New Jersey, 1990, p. 269–271, or Popov, High Density Plasma Sources, Noyes Publications, New Jersey, 1995, p. 408–410.

The following are known as industrially usable PECVD systems:
- piping systems for simultaneous surface coating of more than 100 crystalline silicon wafers (Rossnagel et al., Handbook of Plasma Processing Technology, Noyes Publications, New Jersey, 1990, p. 269–271),
- closed continuous systems with air locks for coating large-area substrates (e.g. glass panes) or of large-area pallets that can be fitted with smaller silicon wafers (JP 0 731 6814 A), and
- open continuous systems without moving air locks for continuous coating of large-area substrates such as glass panes or steel strips (EP 0 574 178 A2).

The aforementioned systems have however considerable drawbacks in respect of an inexpensive coating of two-dimensional objects, in particular crystalline silicon wafers.

In piping systems, a long boat of graphite plates is filled with up to 100 Si wafers and moved into a heated quartz glass tube. The individual graphite plates are electrically connected in pairs, so that when a voltage is applied a plasma burns between all the plates and leads to activation of the introduced process gases.

To achieve a high throughput, several alternatingly usable plasma tubes and a large number of "wafer boats" are required, involving heavy expenditure for the necessary conveying system for the boats.

The loading of fragile silicon wafers into the boats by robotic stations is a very cost-intensive process, since a large number of different positions must be loaded and the spacing between the individual plates in the boat is very narrow.

Not only the wafers, but also the required glass tube is coated with SiN. This entails an interruption after only a small number of coating operations in order to etch clean the walls of the glass tube. In addition, expensive and in some cases environmentally harmful etching gases (CFCs) are necessary.

Because of the high mass of the boats, long heating-up cycles are necessary that limit the throughput of the system.

In piping systems, deposition is only possible using parallel plasma plates. This necessitates a good electrical contact between the silicon wafers and the graphite plates.

Catering for this requirement is posing more and more problems, since modern (inexpensive) silicon wafers for photovoltaic use are manufactured using methods that as a rule result in wavy substrates (band pulling method) (see for example Haefer, *Oberflächen-und Dünnschicht-Technologie, Teil I Beschichtungen von Oberflächen*, Springer-Verlag Berlin, 1987, p. 168–169).

The homogeneous coating of large wafers is problematic, since as the wafer size increases a homogeneous distribution of gas over the wafer and along the boat becomes more difficult.

An in-situ quality check is not possible. In the event of a system fault, the entire batch (of about 100 Si wafers) will be lost.

Closed continuous systems avoid many of the problems of piping systems; for example the use of modern plasma sources with a higher excitation density/deposition rate is possible, and an electrical contact to the wafer can be dispensed with. The problems of etching the facility clean is not problematic, since the source can, for example, be attached at the side of a vertically running pallet, so that falling particles cannot hit the wafer. Furthermore, a high surface coating quality can be obtained by the use of remote plasma sources. Despite these advantages, however, there are drawbacks that lead to high coating costs.

For example, the through-flow speed of the pallets is limited by the maximum coating rate of the plasma source used and by the maximum cycle rate of the air lock system used. An increase of these two quantities is only possible at considerable expense with the currently available technology. The pallets must therefore be designed very large in order to assure a required minimum throughput of the facility. This leads to a number of further problems, since a homogeneous coating of the pallet becomes more and more difficult as the size increases, the filling of a large pallet with individual wafers requires—as in piping systems—complicated and expensive robotics, and the entire facility assumes very large proportions. The latter problem inevitably leads to high investment costs.

Open continuous systems without moving air locks for the coating of crystalline silicon wafers are not currently used industrially.

Here the solar cells must lie in carriers that pass in a gap-free and endless line in self-sealing manner through a channel with gradually decreasing pressure. Very high demands must be placed on the solar cell carriers as regards their mechanical stability, so that they can exercise a sufficient sealing function. This is problematic in respect of the following two aspects and therefore leads to high manufacturing costs.

The carriers are subjected to extreme temperature changes, since the coating of the solar cells as a rule takes place at temperatures above 300° C. There is a risk that they become warped as a result.

The carriers are also coated. This changes their sliding properties and their geometrical dimensions. In addition, the carriers must be freed of this surface coating in the course of maintenance work. For carriers, which are precision tools, this process must be performed very carefully, and is consequently cost-intensive. If for design reasons (friction, thermal expansion etc.) high tolerances in the gap width between carrier and guide channel are unavoidable, a relatively strong air current results. This current can be completely drawn off using large vacuum pumps, but there are the risks that the wafers might start to wobble under the current and break, or that an excessive number of particles might collect in the facility.

SUMMARY OF THE INVENTION

It is therefore an object of the invention to provide an array and a method for coating of in particular two-dimensional objects such as Si wafers, and a method for coating of such wafers in which the objects are to be individually coated, simultaneously achieving a high cycle rate.

It is a further object of the invention that the objects being coated are not subjected to any high air currents leading to their destruction.

It is still another object of the invention to avoid the use of sealing carriers.

To solve these and other objects, the invention is directed to an array having a hollow cylinder open at the ends and a plunger axially movable therein having at least one receptacle with plunger opening passing through opposite wall areas of the plunger, through which opening the object can be inserted/removed, the hollow cylinder comprising at least one first area and one second area that can be sealed off from the plunger, the first area being at the end of the hollow cylinder and having an axial extent that is greater than the receiving opening in its axial extent. The second area can be evacuated and is sealed against atmospheric pressure relative to the plunger regardless of the latter's position, and the second area or a further (third) evacuatable area can be passed through via a cylindrical opening by a conveying means as a transfer device when the receptacle of the plunger is aligned with this area for transfer of the object to the coating device or for receiving the object from the coating device.

In particular, the array comprises two hollow cylinders disposed parallel to one another and each having at least one first area and one second area, wherein in the respective hollow cylinder a plunger having at least one receptacle with openings passing through opposite walls of the plunger is axially movable, wherein the cylinders are aligned with one another such that their respective cylinder openings are linked by a first conveyor section passing through the coating device, and wherein when the one receptacle of the plunger is aligned with the first conveyor section said plunger seals the first area of the hollow cylinder at its end against atmospheric pressure. Moreover, it is provided that the plunger has two receptacles with receiving openings and that when the one receptacle is aligned with the conveyor section passing through the coating device the other receptacle is outside the hollow cylinder and its receiving opening is aligned with a further (second) conveyor section. Here the second conveyor section can comprise a transfer device for removal of a coated object from the second conveyor section while an uncoated object is simultaneously provided to it. In other words, the first and second receptacles of each plunger are spaced such that when one receptacle is aligned with the first conveyor device the other receptacle is outside the cylinder and aligned with the second conveyor device.

In accordance with a further embodiment of the invention, the receptacle of the plunger receiving a coated object can be passed through by a second conveying device when said receptacle is aligned with the second conveyor section.

Here the first and second conveying devices are in particular a lifting device such as a lifting cylinder, using which the objects or carriers receiving the objects can be moved in a line along the first and second conveyor sections. The first conveying device is connected to the cylinder in respect of pressure such that equal pressure conditions prevail.

A particularly high cycle rate is obtained when the cylinder opening passed through by the first conveying device is in the center of the cylinder and symmetric with the respective ends of the cylinder, and a second conveyor section is at each end, where the plunger has a length such that when one of the two receptacles is aligned with one of the two conveyor sections the plunger seals the first area at the other end of the cylinder.

With the teachings in accordance with the invention, an open continuous system is provided, with the aid of which objects can be individually coated and conveyed in an endless line through a channel formed by the cylinder with gradually or approximately gradually changing pressure, where the air locks formed by the interaction of the plunger and the hollow cylinder operate without additional valves, without however involving the risk of strong air currents occurring that could lead to damage or destruction of objects. Furthermore, it is not necessary to convey the objects on sealing workpiece carriers, since the latter do not have to exercise a sealing function between areas of differing pressure thanks to the teachings in accordance with the invention. As a result, the drawbacks generally present in PECVD systems in respect of workpiece carriers with sealing function are avoided, the latter being subjected to high temperatures, rapid temperature changes and parasitic coating. Cleaning cycles are insignificant.

With the teachings in accordance with the invention, the advantages both of a classic air lock system with intermediate chamber and of an open continuous system with gradual pressure lowering are used without their drawbacks being adopted. To do so, elements of simple design that have long service lives and require little maintenance are used.

If necessary, surface recesses extending in the axial direction of the plunger can be provided, via which a link is achieved between consecutive cylinder areas having differing pressures when the plunger is adjusted, in order to permit a certain pressure equalization before the receptacle enters a new area, i.e. a cylinder segment with pressure diverging from the previous area. The corresponding axial recesses can be made by milling processes in the plunger outer wall, starting from the receptacles on both sides of their openings.

A method for coating of two-dimensional objects in particular using the continuous method, and in particular for coating of Si wafers, for example by low-pressure chemical vapor deposition, is characterized by the process steps:

supply of an uncoated object to a first conveyor section using a transfer device at atmospheric pressure, transfer of the uncoated object to a second conveyor section, along which the atmospheric pressure is gradually reduced to a value that is adapted to the pressure necessary for coating of the object, transfer of the object to a third conveying device passing through a coating device, transfer of the coated object to a fourth conveyor section, inside which the pressure is gradually adjusted to the atmospheric pressure, transfer to the first conveyor section and removal of the coated object by the transfer device.

The four conveyor sections here form an endless conveyor section inside which the pressure is decreased or increased to the required extent, where the objects are conveyed in a line inside the first and second conveyor sections by pushing. Here the second and fourth conveyor sections in particular can pick up/deposit uncoated objects from one of the two first conveyor sections, which each have a transfer device, where the two first conveyor sections and the second, third and fourth conveyor sections form self-contained annular or figure-eight conveyor systems.

BRIEF DESCRIPTION OF THE DRAWINGS

Further details, advantages and features of the invention are apparent from the following description of a preferred embodiment shown in the following drawing figures, in which.

DESCRIPTION OF THE PREFERRED EMBODIMENTS

Figure 1:
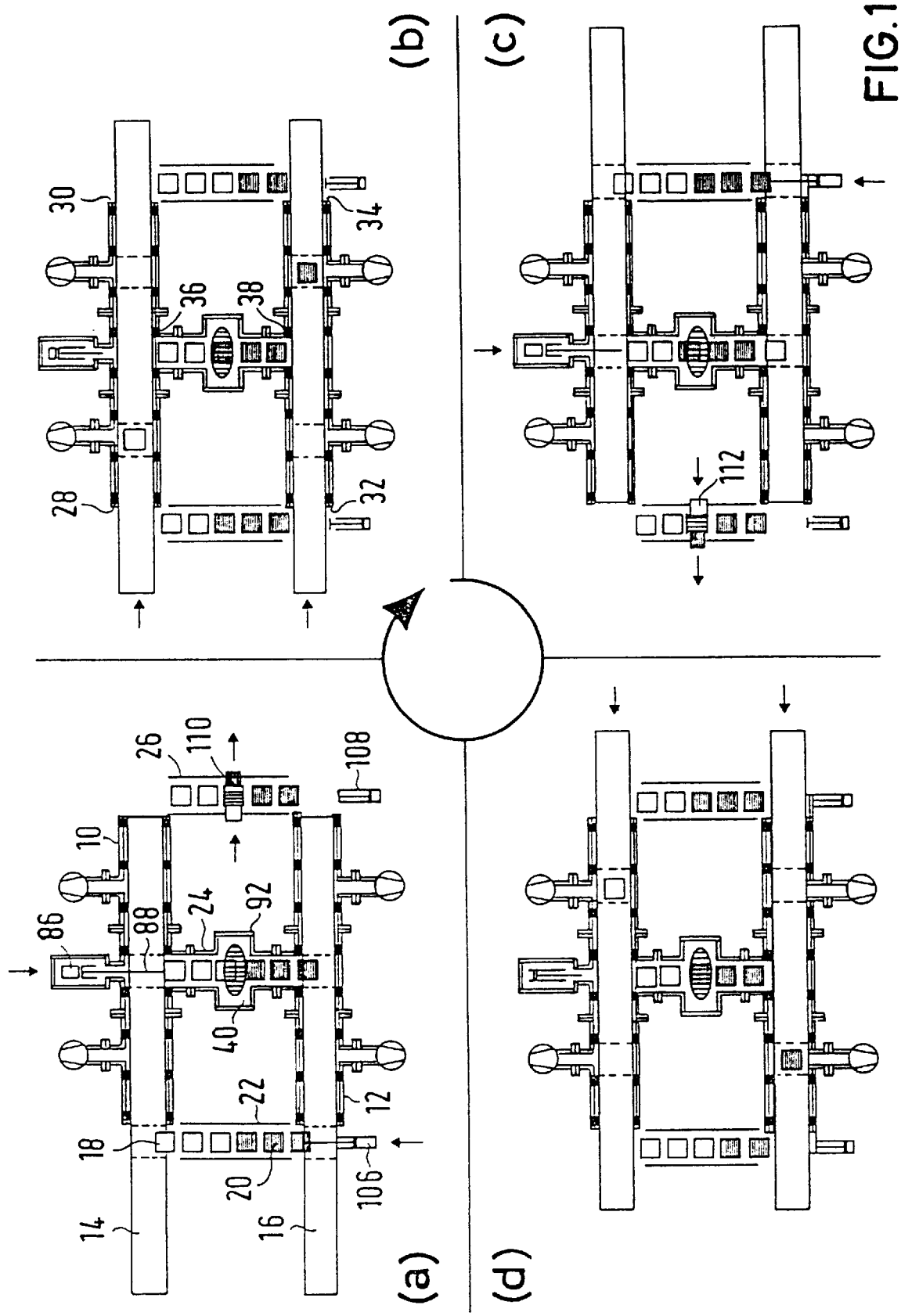
FIGS. 1a–d are plan views in cross-section of an apparatus for conveying objects to be coated with area containing a coating device, the views being sequential and showing operation of the apparatus.
Figure 2A:
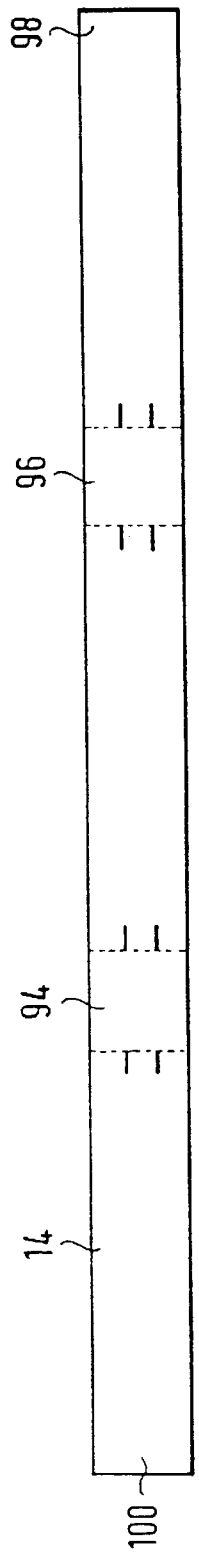
FIGS. 2a, b show a top view and a side view, respectively of a plunger receiving coated or to-be-coated objects.
Figure 2B:

FIG. 1 shows purely in principle an array for conveying and coating of two-dimensional objects, the latter being understood in particular as Si wafers, which are coated in a coating zone in particular by plasma-enhanced chemical vapor deposition (PECVD). This uses the advantages of a classic air lock method with an intermediate chamber and of an open continuous system with gradual reduction of the pressure. When only wafers are mentioned as objects in the following, this should on the one hand include their transport in receptacles such as carriers and on the other hand not limit the teachings in accordance with the invention.

The main parts of the array are hollow cylinders 10, 12 disposed parallel to one another, in which a hollow plunger 14, 16 respectively is axially movable in order to receive uncoated wafers 18 or coated wafers 20 from conveyor sections 22, 24, 26, or to transfer such wafers to these conveyor sections. Two of the conveyor sections 22, 26 are in the respective end areas 28, 30 and 32, 34 of the hollow cylinders 10, 12 respectively, while the middle conveyor section 24 is connected via openings 36, 38 to the central area of the respective hollow cylinder 10, 12. The conveyor section 24 here comprises a coating chamber 40 in which the Si wafers are coated using plasma-enhanced chemical vapor deposition. To that end, it is necessary for the coating zone 40 to have a requisite negative pressure, and therefore, the conveyor section 24 is on the one hand connected in pressure-tight fashion to the hollow cylinders 10, 12 and on the other hand sealed against the atmosphere.

Figure 3:
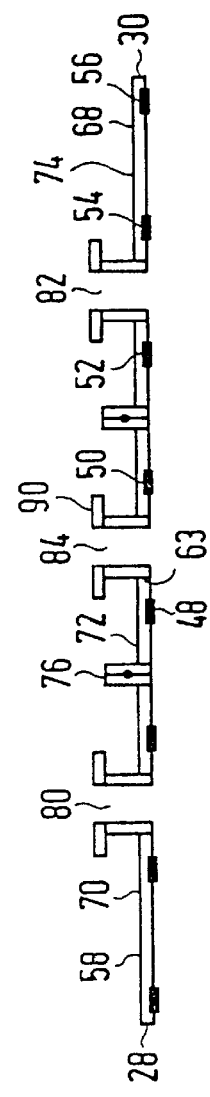
FIG. 3 is a plan view in cross-section of a hollow cylinder receiving the plunger in accordance with FIG. 2.
Figure 3:
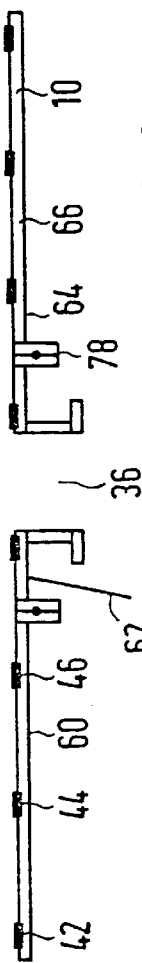

As the detailed view in FIG. 3 makes clear, each cylinder—the example in FIG. 3 is cylinder 10—is divided by sealing rings 42, 44, 46, 48, 50, 52, 54, 56 acting as sliding rings into areas 58, 60, 62, 63, 64, 66, 68. Furthermore, the hollow cylinder 10 can be composed of segments 70, 72, 74 that are connected using flanges 76, 78.

Inside the hollow cylinder 10, the hollow plunger 14 is axially movable, with the sealing rings 42, 44, 46, 48, 50, 52, 54, 56 being in tight contact with its outer surface. As a result, the areas 58, 60, 62, 63, 64, 66, 68 are sealed off from one another, so that different pressures can be built up inside them.

To that end, inner areas—in the described embodiment the second areas 60, 66 connecting to the outer or first areas 58, 68 by flange connections 80, 82—can be connected to vacuum pumps.

The area 63 in the center between the end areas 28, 30 of the cylinder 10 has passage openings 36, 84 in opposite walls through which slide 88 can pass, operated by a lifting cylinder 86. To that end, a housing receiving the lifting cylinder 86 extends from a flange surrounding the opening 84. The flange surrounding the opening 36 is connected to a housing 92 surrounding the conveyor section 24.

The hollow plunger 14 has two receptacles or receiving chambers 94, 96 that are adapted in their distance from one another to the distance between the opening 36 in the central area 63 and the end area 28, 30 of the hollow cylinder 10 such that when one of the receiving chambers 94, 96 is aligned with the opening 36 the other receiving chamber 96, 94 is outside the hollow cylinder 10 at its one end area 28 or 30 respectively. The hollow plunger 14 extends beyond the receiving chambers 94, 96 over a length such that when one of the receiving chambers 94 or 96 is outside the cylinder 10 the opposite area of the hollow plunger 14 is in sealing contact with the other outer sealing ring 56 or 42 respectively. If for example the receiving chamber 94 is outside the hollow cylinder 10 at the end area 28, the hollow plunger 14 with its other end area 98 seals the hollow cylinder 10 using the sealing ring 56. Conversely, the hollow plunger 14 is in sealing contact with the sealing ring 42 with its other end 100 when the chamber 96 is outside the hollow cylinder 10 in the end area 30.

The chambers 94, 96 are accessible via slotted openings 102, 104, with each opening 102, 104 being formed by penetrations provided in opposite walls of the hollow cylinder 14, such that the slide 88 can pass through the chambers 94, 96 when the latter are aligned with the opening 84, 36 respectively of the hollow cylinder 10.

The receptacles or receiving chambers 94, 96 are of course sealed off from one another and from the nearby end areas. In particular, each chamber 94, 96 has an axial extent that is equal to or slightly longer than the respective opening 102, 104 in its axial extent. Furthermore every chamber 94, 96 should have intermediate walls or elements with the same effect aligned with the apertures in the walls of the hollow plunger 14, 16 forming the openings 102, 104, in order to ensure a smooth transition from the respective receiving chamber to one of the associated conveyor sections 22, 24, 26.

As FIG. 1 makes clear, the first conveyor sections 22, 26 run directly in the area of the end areas 28, 30 respectively of the hollow cylinders 10, 12 on which the chamber 94 or 96 of the hollow cylinders 14, 16 is aligned when the other chamber 96 or 94 is aligned with the opening 36 or 38 of the hollow cylinder 10, 12 respectively.

The hollow cylinder 12 differs from the hollow cylinder 10 to the extent that only the opening 38 leading to the conveyor section 24 is provided, whereas an opening corresponding to the opening 84 is absent. This is not required in cylinder 12, since the slide 88 conveys the Si wafers 18, 20 through the conveyor section 24 in a line extending from the hollow cylinder 10, i.e. the cylinder 12 must not have a corresponding conveying device passing through it.

By contrast, both hollow plungers 14, 16 must have diametrically opposed openings 102, 104 and passing through wall sections; because the hollow cylinder 14 movable inside the hollow plunger 10 is passed through by the slide 88 aligned with the inner conveyor section 24 passing through the coating device 40, and the openings 102, 104 provided in the hollow plunger 16 are passed through by further slides 106, 108 outside the hollow cylinder 12 and aligned with the first conveyor sections 22, 24, in order to convey Si wafers disposed on these conveyor sections. This is also achieved by the wafers 18, 20 or the carriers receiving them being moved in a line by pushing or sliding.

Furthermore, each conveyor section 22, 26 has a transfer device 110, 112 using which enables synchronous transfer of uncoated and coated Si wafers. This is indicated by the arrows in the area of the transfer station 110, 112.

The first conveyor sections 22, 26, the hollow plungers 14, 16 axially movable in the hollow cylinders 10, 12, and the conveyor section 24 accommodating the coating zone 40 represent a closed conveying system through which objects such as Si wafers 18, 20 to be coated and already coated are continuously passed.

The underlying idea is based on the hollow plunger 14, 16 that is axially movable in the cylinder 10, 12 respectively open at both sides. The cylinders 10, 12 themselves are divided by the sliding and sealing rings 42, 44, 46, 48, 50, 52, 54, 56 into the areas 58, 60, 62, 63, 64, 66, 68 in which a pressure reduction takes place starting from the outside towards the center of the cylinder 10 and conversely a pressure buildup from the inside to the outside takes place in the hollow cylinder 12. Each hollow plunger 14, 16 has two receiving chambers 94, 96 for receiving uncoated objects 18 (plunger 14) or uncoated objects (plunger 16). The plungers 14, 16 are synchronously moved such that one of the chambers 94, 96 moves completely out of the cylinder 10, 12 in alternating manner, in order to receive an uncoated Si wafer 18 with a carrier at atmospheric pressure (plunger 14) or to remove a coated Si wafer 20 with carrier out of the plunger 16. The synchronous receiving/removal is performed using the slides 106 and 108, in alternating manner in one of the end areas 28, 30 of the hollow cylinders 10, 12.

As soon as a Si wafer is placed in the hollow plunger 14, in chamber 94 in the embodiment in accordance with FIG. 1a, the plunger 14 is moved to the right, so that the chamber 94 is moved via one or more low-pressure stages formed by the areas 58, 60, 62 to the opening 36, in order to transfer the Si wafer to the conveyor section 24 by means of the slide 88 and convey it along the conveyor section 24 to the coating zone 40. While the receiving chamber 94 is aligned with the conveyor section 24, the chamber 96 is aligned with the right-hand first conveyor section 26 as shown in FIG. 1c, in order to receive an uncoated Si wafer in the manner described above.

The plunger 16 is moved synchronously with the plunger 14, where—as already described—the receiving of a coated Si wafer 20, i.e. alignment of one of the chambers 94, 96 with the opening 38 and subsequent axial adjustment of the plunger 16 inside the cylinder 12, is followed by a pressure buildup in order to permit transfer of the coated Si wafer 20 to one of the first conveyor sections 22, 24 by means of the slides 106, 108 respectively.

By the synchronous movement of the plungers 14, 16 and of the conveying device in the form of slides or lifting cylinders 96, 106, 108, coating of two-dimensional objects such as Si wafers in particular can be performed with a high cycle rate, without the risk of the objects being damaged in particular by unwanted draught air formation.

By means of the teachings in accordance with the invention, rapid evacuation of the chambers 94, 96 is possible without mechanically operated air lock gates and valves. The carrier receiving the objects to be coated does not itself need to assume any sealing function, as is usually the case with continuous systems. As a result of this, a very simple and inexpensive design can be selected for the achievement of long service lives, since wide tolerances are permissible in respect of geometry, warping due to temperature change and growth of a surface layer. Coarse cleaning by sandblasting is also possible.

The hollow plungers themselves undertake the end-side movement of the carriers for the objects to be coated inside the carrier circuit. This ensures a simplification of the transportation mechanism outside the low-pressure range. If a surface coating source is used and if the carriers are guided with sufficient absence of friction inside the first and second conveyor sections, the entire transport of the carriers can be achieved using the pneumatic cylinders or the slides extending from these.

If the cycle rates are to be reduced, the teachings in accordance with the invention can also be implemented, in which only a first conveyor section 22 or 26 is present in one of the end areas 28 or 30 of the hollow cylinders 10, 12. In this case, the hollow plunger 14, 16 only needs to have one receiving chamber. Also, the second conveyor section 24 too can be in the other end area of the hollow cylinder 10, 12 relative to the first conveyor section 22 or 26.

In order to achieve a uniform evacuation or venting of the chambers 94, 96, it is possible to provide, starting from the area of the chamber limits 94, 96, outer wall longitudinal slots in the axial direction of the hollow plungers 14, 16, for example by milling, as a result of which a certain pressure compensation between the individual areas 58, 60, 62, 63 and 68, 66, 64, 63 takes place when the sealing rings 42, 44, 46, 48 and 56, 54, 52, 50 respectively are traversed and vice versa, without a direct connection being made between the atmospheric pressure and the area 60, 66 connected to the vacuum pump.

What is claimed is:

1. An apparatus for performing two-dimensional surface coating of objects, comprising:

a hollow cylinder open at opposite ends thereof;

a plunger axially moveable therein and having at least one receptacle with a receiving opening of an axial extent through which the object can be inserted and removed; and a first conveying means for conveying objects to be coated;

the hollow cylinder comprising at least one first area and a second area which can be sealed off from the plunger, the at least one first area being at an end of the hollow cylinder and having an axial extent greater than the axial extent of the receiving opening, the second area being sealed against atmospheric pressure relative to the plunger regardless of plunger position, wherein the second area of the hollow cylinder is constructed and arranged for passing transversely therethrough by the first conveying means when the receptacle is aligned therewith, for transfer of an object to or from a coating device.

2. Apparatus according to claim 1, wherein the plunger has two spaced receptacles, each having openings through opposite wall areas of the plunger.

3. Apparatus according to claim 1, wherein the plunger is hollow only at the receptacle.

4. Apparatus according to claim 1, comprising two of said hollow cylinders disposed generally parallel to each other, and two plungers axially movable therein, each of said hollow cylinders having one first area and one second area, and each of said plungers having at least one receptacle, wherein the cylinders are aligned such that the openings of each are aligned with each other via the first conveying means which passes through a coating device, and wherein when an opening is aligned with the first conveying means, the plunger seals the first area of the hollow cylinder against atmospheric pressure.

5. Apparatus according to claim 4 wherein each plunger has two receptacles, and when one of said receptacles is aligned with the first conveying means passing through the coating device, the other of said receptacles is outside of the cylinder and is aligned with a second conveying means.

6. Apparatus according to claim 5, wherein the second conveying means comprises a transfer means for removing a coated object therefrom while an uncoated object is simultaneously supplied thereto.

7. Apparatus according to claim 5, wherein the receptacle receiving the coated object can be traversed by a conveying means aligned therewith for transfer of the coated object onto the second conveying means.

8. Apparatus according to claim 4, wherein a second conveying means is disposed between respective end areas of the two cylinders.

9. Apparatus according to claim 4, wherein the first conveying means passes through a coating device centrally between two second conveying means disposed at ends of the cylinders and is generally parallel thereto, and wherein one of the plungers picks up and conveys objects to be coated and the other plunger picks up and conveys coated objects, the cylinder with the objects to be coated being traversed by the first conveying means, and the cylinder with the coated objects being traversed by a second conveying means.

10. Apparatus according to claim 1, wherein the first conveying means comprises a lifting device for simultaneously moving a plurality of objects located thereon.

11. Apparatus according to claim 3, wherein the first conveying means is disposed in a space having a pressure-tight connection to the hollow cylinder.

12. Apparatus according to claim 1 wherein the plunger has two spaced receptacles, each having openings through opposite wall areas of the plunger, and wherein the receptacles are spaced by a distance such that when one receptacle is aligned with the first conveying means, the other receptacle is outside of the cylinder and is aligned with a second conveying means.

13. Apparatus according to claim 1, wherein the cylinder comprises two areas connected to means for reducing pressure therein, and sealed off against adjacent areas.

14. Apparatus according to claim 1, wherein the plunger comprises external axial grooves through which a pressure connection is made between successive areas of the cylinder during movement of the plunger.

* * * * *